(12) United States Patent
Hasunuma et al.

(10) Patent No.: US 8,105,907 B2
(45) Date of Patent: Jan. 31, 2012

(54) MANUFACTURING METHOD OF SEMICONDUCTOR MEMORY DEVICE

(75) Inventors: Eiji Hasunuma, Chuo-ku (JP); Shigeru Shiratake, Chuo-ku (JP); Takeshi Ohgami, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 197 days.

(21) Appl. No.: 12/696,695

(22) Filed: Jan. 29, 2010

(65) Prior Publication Data

US 2010/0197097 A1 Aug. 5, 2010

(30) Foreign Application Priority Data

Jan. 30, 2009 (JP) ................................. 2009-019787

(51) Int. Cl.
*H01L 21/336* (2006.01)
(52) U.S. Cl. ........ 438/284; 438/233; 438/299; 438/675; 257/E21.44; 257/E21.585
(58) Field of Classification Search .................. 438/213, 438/284, 599; 257/E21.051, E21.176, E21.37, 257/E21.4, E21.42, E21.44
See application file for complete search history.

(56) References Cited

U.S. PATENT DOCUMENTS

| 7,215,562 B2 | 5/2007 | Sekine |
| 2002/0027259 A1 * | 3/2002 | Ikemasu et al. ............... 257/499 |
| 2008/0008013 A1 | 1/2008 | Ohgami et al. |

FOREIGN PATENT DOCUMENTS

| JP | 2003-068880 A | 3/2003 |
| JP | 2005-347578 A | 12/2005 |
| JP | 2008-016749 A | 1/2008 |

* cited by examiner

*Primary Examiner* — Cheung Lee
(74) *Attorney, Agent, or Firm* — Sughrue Mion, PLLC

(57) ABSTRACT

To provide a manufacturing method of a semiconductor memory device, the method including forming contact plugs to be connected to a drain region or a source region of each of transistors, by using a SAC line technique of selectively etching an insulation layer that covers each of the transistors by using a mask having a line-shaped opening provided across the contact plugs. Each of the transistors constituting a sense amplifier that amplifies a potential difference between bit lines is a ring-gate transistor.

14 Claims, 11 Drawing Sheets

MANUFACTURING METHOD OF SEMICONDUCTOR MEMORY DEVICE

BACKGROUND OF THE INVENTION

1. Field of the Invention

The present invention relates to a manufacturing method of a semiconductor memory device, and more particularly relates to a manufacturing method of a semiconductor memory device that uses a ring-gate transistor.

2. Description of Related Art

In a DRAM (Dynamic Random Access Memory), a sense amplifier is connected to each bit line. Although a sense amplifier is a circuit used to amplify a potential difference between a pair of bit lines, the sense amplifier is required to have high sensitivity because the potential difference between the bit lines is very small. Therefore, high current driving capacity is necessary, and current driving capacity needs to be secured by increasing to some extent a channel width of each of transistors constituting a sense amplifier. However, an occupied area of the sense amplifier is limited because of recent downscaling of DRAM cells. Accordingly, a technique of constituting a sense amplifier by using a ring-gate transistor, which is capable of taking a large channel width in a relatively small occupied area, is used in recent years (for example, see Japanese Patent Application Laid-open Nos. 2003-068880, 2005-347578, and 2008-016749).

When a ring-gate transistor is used, a contact plug that connects source/drains region to bit lines is formed by using a technique called a SAC (Self Aligned Contact) hole technique. According to this technique, an upper surface and a side surface of a gate electrode are first covered with a gate gap and a sidewall insulating film made of a silicon nitride. Next, the entire sense amplifier is covered on this with a silicon oxide film. The silicon oxide film is selectively etched by using a mask, thereby providing holes on the source/drain regions. A conductive layer is then embedded into the contact holes, thereby forming the contact plugs in self alignment manner.

The SAC hole technique has this name because a mask used for the above selective etching has holes for respective contacts.

However, the above technique has a problem in that a distance between a contact plug and a gate electrode becomes long. That is, because contact holes are very narrow holes, it takes some time before sufficient holes are formed. This is because it takes time for etchant to move in narrow holes. Accordingly, to prevent gate electrodes from being damaged, a gate gap and a sidewall need to have a large thickness to some extent. Consequently, a distance between a contact plug and a gate electrode becomes long corresponding to the large thickness.

When a distance between the contact plug and the gate electrode is increased, the entire size of a transistor is enlarged. This is a cause of hindering downscaling of a DRAM in its entirety, that is, reduction of a chip size.

Such a problem can occur not only to a sense amplifier of a DRAM but also to other types of circuits that use a ring-gate transistor.

SUMMARY

In one embodiment, there is provided a manufacturing method of a semiconductor device including sense amplifiers that amplifies a potential difference between bit lines, the method comprising: forming a ring-shaped gate electrode and source and drain regions for transistors constituting the sense amplifiers; forming an insulating layer over the transistors; forming a mask layer on the insulating layer, the mask layer having a line-shaped opening that expose an area of the insulating layer covering respective portions of the source and drain regions of each of the transistors; and forming a plurality of contact plugs each electrically connected to an associated one of the source and drain regions by using a line SAC (Self-Align Contact) technique in which the area of the insulation layer is selectively removed by use of the mask layer.

In another embodiment, there is provided a manufacturing method of a semiconductor device, comprising: forming a plurality of substantially cylindrically-shaped gate electrodes covered with an insulation film; forming drain regions and source regions on the semiconductor substrate to form a plurality of transistors, each of the drain regions and each of the source regions correspond to an associated one of the gate electrodes; covering the transistors by an interlayer insulation layer; forming a plurality of contact holes partitioned by the insulation films and the interlayer insulation layer from one another by selectively removing the interlayer insulation layer by using a mask formed on the interlayer insulation layer, the mask having a line-shaped opening positioned over respective parts of the source and drain regions of the transistors with an intervention of the interlayer insulation layer; and forming a plurality of contact plugs that are embedded in the contact holes.

In still another embodiment, there is provided a manufacturing method of a semiconductor device, comprising: defining an active region by a dielectric isolation region; forming a plurality of ring-gate structures for a plurality of transistors along the active region, each of the ring-gate structures having an upper surface and a side surface covered with an insulation film; forming a plurality of first regions each of which serves as one of a source region and a drain region of an associated one of the transistors, the first regions being portioned on the active region corresponding to an internal portion surrounded by an associated one of the ring-gate structures; forming a plurality of second regions each of which serves as other one of the source region and the drain region in common to each of the transistors, the second regions being portioned on the active region corresponding to an external portion of each of the ring-gate structures; covering the active region and the ring-gate structures by an interlayer insulation layer; forming a mask layer on the interlayer insulation layer having a line-shaped opening positioned over the internal portions of the ring-gate structures, a part of the ring-gate structures, and portions sandwiched by adjacent ring-gate structures with an intervention of the interlayer insulation layer; selectively removing the interlayer insulation layer by using the mask layer and the insulation film as a mask to form contact holes; and forming contact plugs within the contact holes, each of the contact plugs being connected to an associated one of the source and drain regions.

According to the present invention, openings of a mask are provided in a line shape across plural contact plugs. Therefore, etchant can efficiently move within contact holes, as compared with holes formed by the SAC hole technique. Accordingly, a distance between a contact hole and a gate electrode can be reduced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will be explained below in detail with reference to the accompanying drawings.

Figure 1:
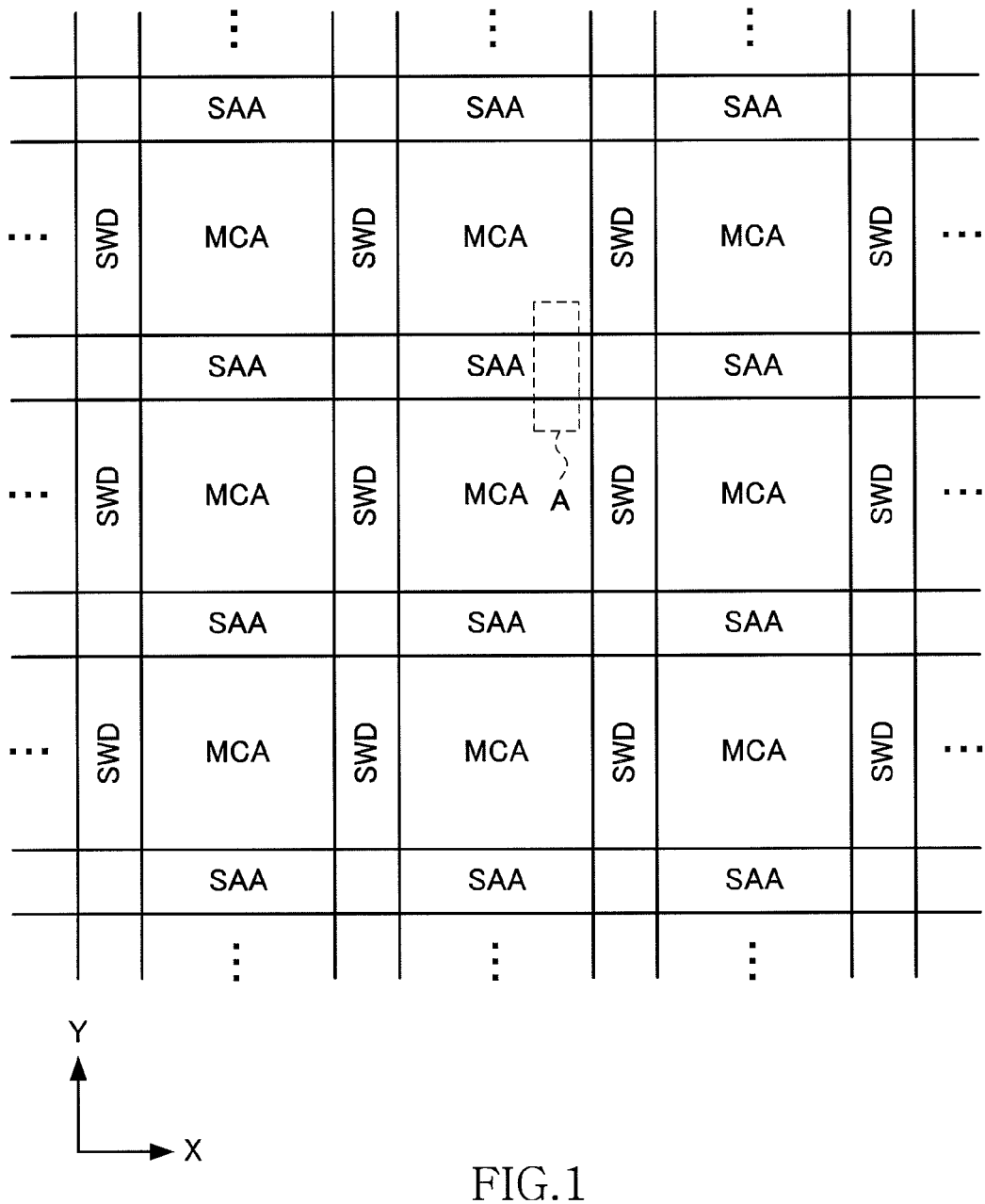
FIG. 1 shows a configuration of a semiconductor memory device according to an embodiment of the present invention.

FIG. 1 shows a configuration of a semiconductor memory device according to an embodiment of the present invention. This semiconductor memory device is a DRAM, and FIG. 1 shows only a part of a configuration within a memory mat of the DRAM.

As shown in FIG. 1, the semiconductor memory device according to the present embodiment has plural memory cell areas MCA arranged in a matrix shape. A sub-word area SWD is provided between memory cell areas MCA adjacent in an X direction, and a sense amplifier area SAA is provided between memory cell areas MCA adjacent in a Y direction. The X direction is an extension direction of sub-word lines SWL, and coincides with a longitudinal direction of the sense amplifier areas SAA. The Y direction is an extension direction of bit lines BL, and coincides with a longitudinal direction of sub-word lines SWD.

Figure 2:
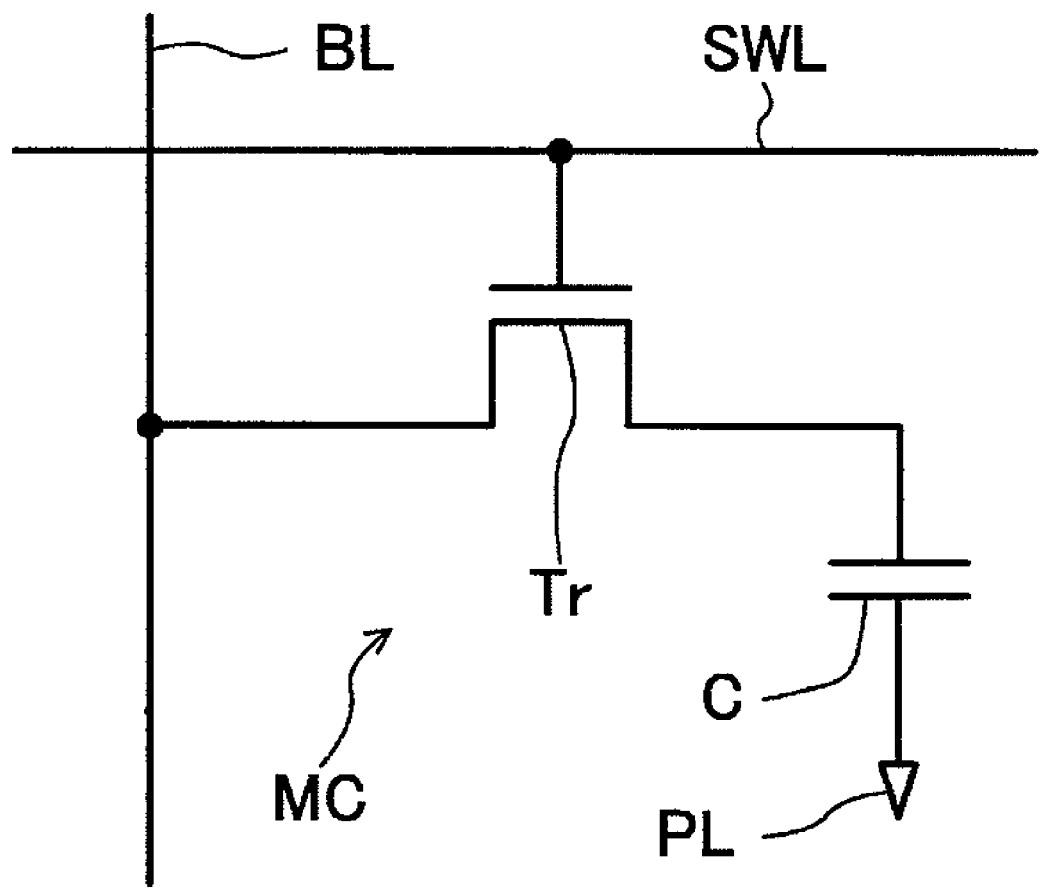
FIG. 2 is a circuit diagram of a memory cell according to an embodiment of the present invention.

Many (for example, 256K) memory cells MC are arranged in each memory cell area MCA. As shown in FIG. 2, each memory cell MC is configured by a cell transistor Tr and a cell capacitor C connected in series between a bit line BL and a plate wiring PL, and a gate electrode of the cell transistor Tr is connected to a corresponding sub-word line SWL. With this arrangement, when the sub-word line SWL becomes at a high level, a corresponding cell transistor Tr is turned on, and a cell capacitor C is connected to a corresponding bit line BL.

To write data into the memory cell MC, a high-order writing potential VARY (1.4 V, for example) or a low-order writing potential VSSA (0 V, for example) is supplied to the cell capacitor C, corresponding to data to be stored.

On the other hand, to read data from the memory cell MC, the bit line BL is precharged at an intermediate potential, that is, (VARY-VSSA)/2 (0.7 V, for example, and hereinafter simply referred to as "VARY/2"), and thereafter, the cell transistor Tr is turned on. Accordingly, when the high-order writing potential VARY is written in advance in the cell capacitor C, a potential of the bit line BL slightly increases from the intermediate potential. When the low-order writing potential VSSA is written in advance in the cell capacitor C, a potential of the bit line BL slightly decreases from the intermediate potential.

A sense amplifier SA arranged in each sense amplifier area SAA drives the bit line following the data writing and data reading. Because the semiconductor memory device according to the present embodiment has a characteristic in a manufacturing method of the sense amplifier SA, configurations of the sense amplifier SA and peripheral wirings thereof are explained first. Thereafter, a manufacturing method of the sense amplifier SA is explained in detail.

Figure 3A:
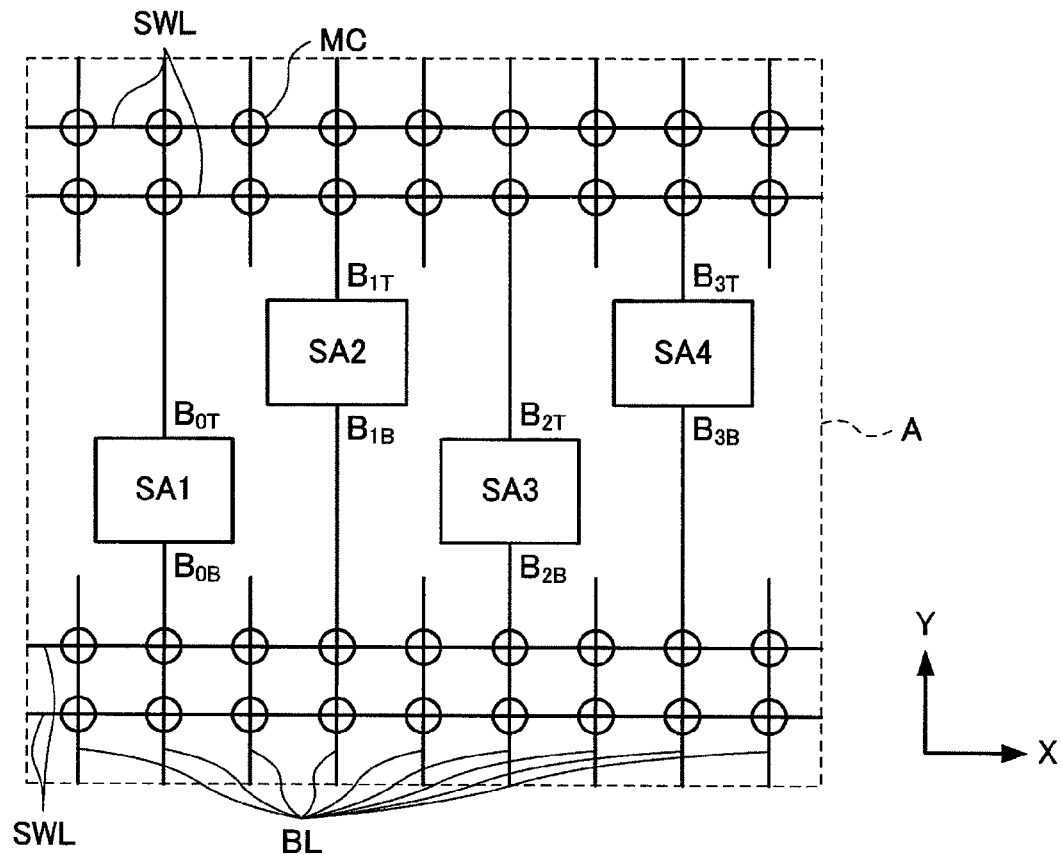
FIG. 3A is a schematic diagram of an area A shown in FIG. 1.

FIG. 3A is a schematic diagram of an area A shown in FIG. 1. As shown in FIG. 3A, the sense amplifier area SAA includes many sense amplifiers SA (FIG. 3A shows four sense amplifiers SA1 to SA4). Each sense amplifier SA is connected to a pair of bit lines BL extended to the Y direction within memory cell areas MCA adjacent in the Y direction. In the present example, each sense amplifier SA is connected to a pair of bit lines BL extended respectively within two memory cell areas MCA adjacent in mutually different directions (the vertical direction in FIG. 3A) from the viewpoint of the sense amplifier SA (an open bit-line system). FIG. 3A shows a pair of bit lines BL connected to a sense amplifier SAi (i=1 to 4), as bit lines $B_{iT}$ and $B_{iB}$, respectively. The "T" represents true, and "B" represents complementary.

As shown in FIG. 3A, the bit lines BL within each memory cell area MCA are connected alternately to sense amplifiers SA within the sense amplifier area SAA. In FIG. 3A, bit lines BL not connected to the sense amplifiers SA are connected to sense amplifiers SA within sense amplifier areas SAA positioned at the opposite sides by sandwiching the memory cell area MCA.

Figure 3B:
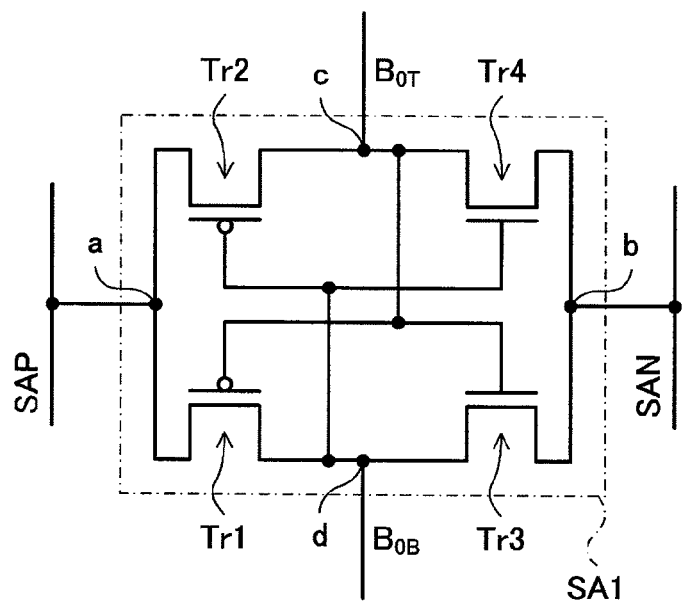
FIG. 3B shows a circuit configuration of the sense amplifier according to an embodiment of the present invention.

FIG. 3B shows a circuit configuration of the sense amplifier SA1. While FIG. 3B shows only the sense amplifier SA1, other sense amplifiers SA have also similar internal circuits.

As shown in FIG. 3B, the sense amplifier SA has four nodes, that is, a pair of power source nodes a and b, and a pair of signal nodes c and d. The power source node a is connected to a high-order driving wiring SAP, and the power source node b is connected to a low-order driving wiring SAN. The signal nodes c and d are connected to corresponding bit line pairs $B_{0T}$ and $B_{0B}$, respectively. The sense amplifier SA is activated by supplying the high-order writing potential VARY and the low-order writing potential VSSA to the high-order driving wiring SAP and the low-order driving wiring SAN, respectively.

The sense amplifier SA has also P-channel MOS transistors Tr1 and Tr2 and N-channel MOS transistors Tr3 and Tr4. The transistor Tr1 and the transistor Tr3 are connected in series between the power source node a and the power source node b. A contact between the two transistors is connected to one signal node d, and gate electrodes of these transistors are connected to the other signal node c. Similarly, the transistor Tr2 and the transistor Tr4 are connected in series between the power source node a and the power source node b. A contact between the two transistors is connected to one signal node c, and gate electrodes of these transistors are connected to the other signal node d.

In writing to or reading from the memory cell MC, a potential difference is generated in the bit line pair $B_{OT}$ and $B_{OB}$. When a potential of the bit line $B_{OT}$ becomes higher than a potential of a bar bit line $B_{OB}$, the transistors Tr2 and Tr3 are turned on, and the transistors Tr1 and Tr4 are turned off. Therefore, the power source node a and the signal node c are connected to each other, and the high-order writing potential VARY is supplied to the bit line $B_{OT}$. Further, the power source node b and the signal node d are connected to each other, and the low-order writing potential VSSA is supplied to the bar bit line $B_{OB}$.

Meanwhile, when a potential of the bit line $B_{OT}$ becomes lower than a potential of the bar bit line $B_{OB}$, the transistors Tr1 and Tr4 are turned on, and the transistors Tr2 and Tr3 are turned off. Therefore, the power source node a and the signal node d are connected to each other, and the high-order writing potential VARY is supplied to the bar bit line $B_{OB}$. Further, the power source node b and the signal node c are connected to each other, and the low-order writing potential VSSA is supplied to the bit line $B_{OT}$.

Figure 4:
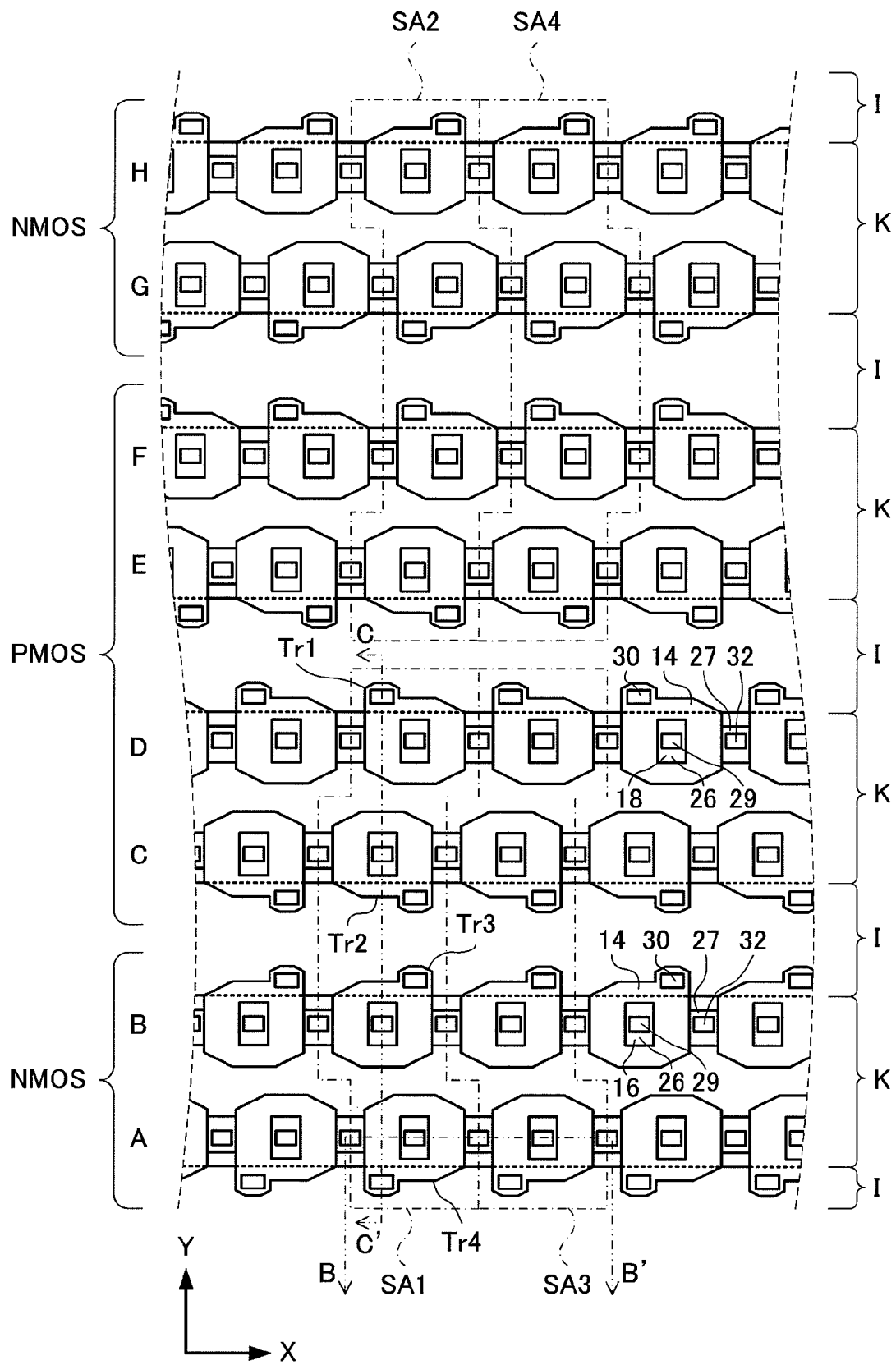
FIG. 4 shows a flat pattern layout of the sense amplifier area according to an embodiment of the present invention.

FIG. 4 shows a flat pattern layout of the sense amplifier area SAA. A ring-shaped structure shown in FIG. 4 is a gate electrode 14 of each of transistors within the sense amplifier SA. That is, each of transistors of the sense amplifier SA is a ring-gate type.

As shown in FIG. 4, in the sense amplifier area SAA, transistors each having the gate electrode 14 of a ring shape are arranged in eight rows in the Y direction. These rows are hereinafter called an A row to an H row in this order from a lower side in FIG. 4. Transistors belonging to each two rows (the A, B, G, and H rows) at both ends are N-channel MOS transistors (NMOS), and transistors belonging to four rows (the C, D, E, and F rows) at the center are P-channel MOS transistors (PMOS).

One sense amplifier SA is configured by four rows of transistors at one side, like the sense amplifiers SA1 to SA4 shown in FIG. 4. Taking a row of the sense amplifier SA1 as an example, as shown in FIG. 4, the transistors Tr1 to Tr4 of the sense amplifier SA1 belong to the A row to the D row, respectively and are arranged in the Y direction, thereby constituting the sense amplifier SA1.

A configuration of the sense amplifier SA is explained in detail with reference to a cross-sectional view of the sense amplifier area SAA as well.

Figure 5:
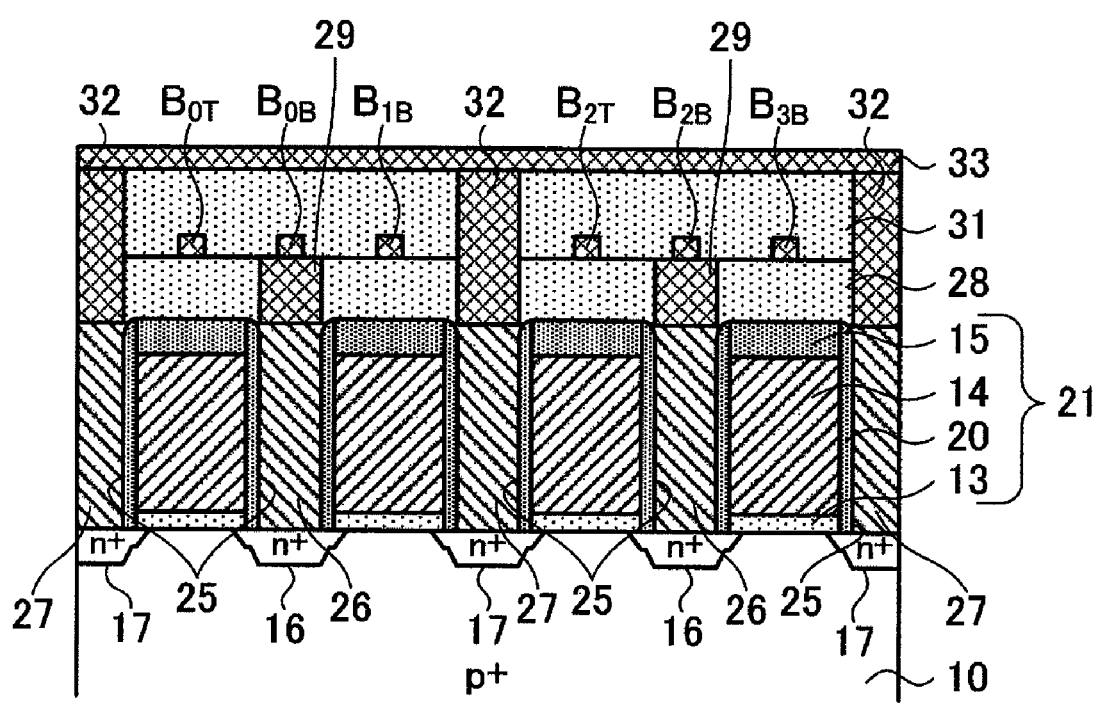
FIG. 5 is a cross-sectional view along a line B-B' in FIG. 4.
Figure 6:
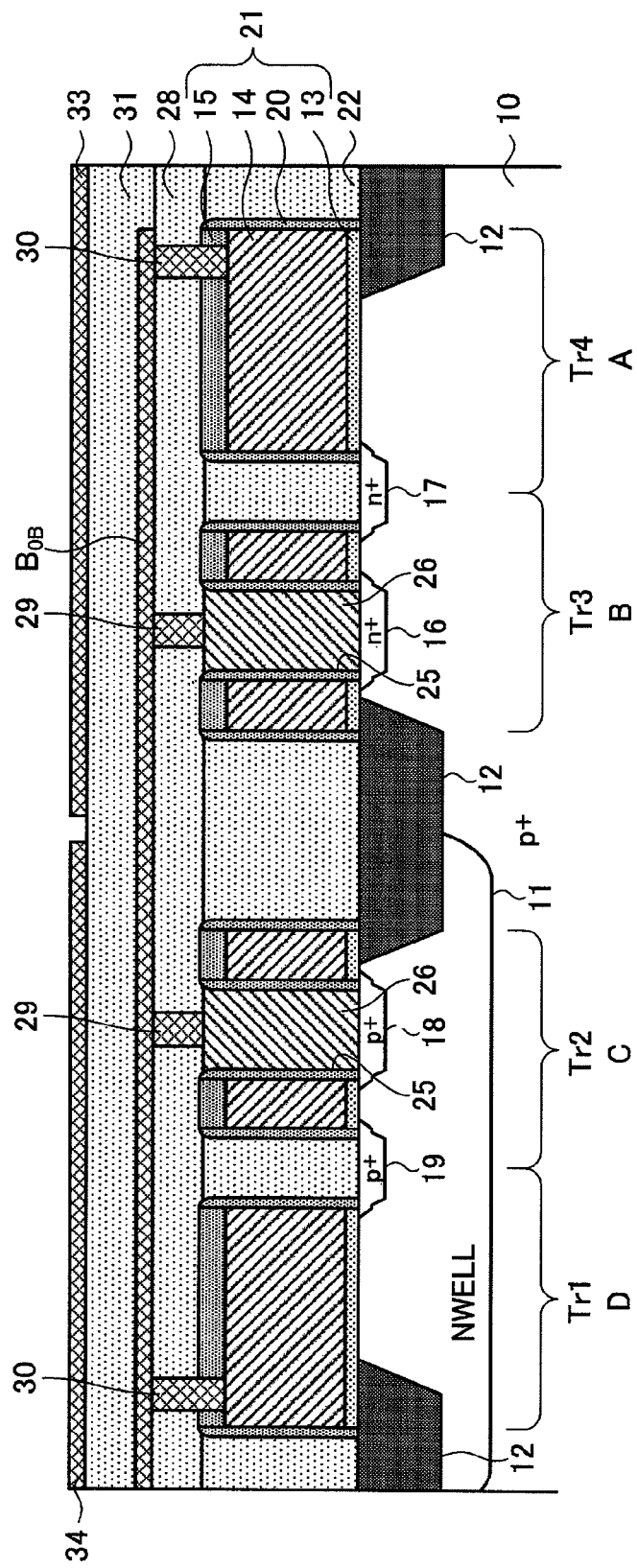
FIG. 6 is a cross-sectional view along a line C-C' in FIG. 4.

FIG. 5 is a cross-sectional view along a line B-B' in FIG. 4, and FIG. 6 is a cross-sectional view along a line C-C' in FIG. 4. As shown in FIGS. 5 and 6, sense amplifiers SA are formed on a surface of a P-type semiconductor layer 10. As shown in FIG. 6, an N-type region (NWELL) 11 is formed near the surface of the P-type semiconductor layer 10, and a P-channel MOS transistor is formed on the N-type region 11.

As shown in FIG. 4, a dielectric isolation region I is provided at the outside of the A row, between the B row and the C row, between the D row and the E row, between the F row and the G row, and at the outside of the H row, respectively. An active region K is partitioned by the dielectric isolation region I. The dielectric isolation region I is configured by an insulation layer 12 shown in FIG. 6 (an STI (Shallow Trench Isolation) method). It is preferable that the insulation layer 12 is configured by a silicon oxide film.

As shown in FIG. 6, the gate electrode 14 of each of transistors is provided on the P-type semiconductor layer 10 or on the N-type region 11 via a gate dielectric film 13 made of silicon oxide and the like. It is preferable that polysilicon, a metal, or silicide, or a laminate film of these materials is used for a material of the gate electrode 14. A cap dielectric film 15 is formed on an upper surface of the gate electrode 14, and a sidewall dielectric film 20 is formed on a side surface of the gate electrode 14, thereby dielectrically isolating each adjacent layer from the gate electrode 14. It is preferable to use a silicon nitride film for materials of the cap dielectric film 15 and the sidewall dielectric film 20. A flat shape of each gate electrode 14 is a ring shape as described above, and the gate electrode 14 has a partially protruding portion as shown in FIG. 4. The protruding portion is connected to a corresponding bit line BL via a gate contact plug 30 as shown in FIG. 6.

A part of the gate electrode 14 including a contact portion with the gate contact plug 30 is provided on the dielectric isolation region I (the insulation layer 12), as shown in FIGS. 4 and 6. Therefore, even when the gate electrode 14 is slightly deviated from a design position, ability of each of transistors can be maintained substantially constantly. In the present embodiment, the flat shape of each gate electrode 14 is completely in a ring shape. Because a channel is not formed in the dielectric isolation region I, substantially the same effect as that of a complete ring shape is obtained even when a part of the ring shape is disconnected on the dielectric isolation region I. Consequently, it is sufficient that the flat shape of each gate electrode 14 is substantially in a ring shape including a U shape having an open end on the dielectric isolation region I, in addition to a complete ring shape. The ring-gate transistor means a transistor constituted by a substantially ring-shaped transistor described above.

On the surface of the P-type semiconductor layer 10, n+ diffusion layers 16 and 17 are formed by impurity ion implantation, at portions not provided with any one of the gate electrode 14, the N-type region 11, and the insulation layer 12. The n+ diffusion layer 16 is a portion positioned at the center of a ring of the gate electrode 14, and the n+ diffusion layer 17 is a portion positioned at the outside of the ring of the gate electrode 14. On the surface of the N-type region 11, p+ diffusion layers 18 and 19 are formed by impurity ion implantation, at portions not provided with any one of the gate electrode 14 and the insulation layer 12. The p+ diffusion layer 18 is a portion positioned at the center of the ring of the gate electrode 14, and the p+ diffusion layer 19 is a portion positioned at the outside of the ring of the gate electrode 14.

The n+ diffusion layer 16 and the p+ diffusion layer 18 at the center of the ring constitute drains of an N-channel MOS transistor and a P-channel MOS transistor, respectively. Meanwhile, the n+ diffusion layer 17 and the p+ diffusion layer 19 at the outside of the ring constitute sources of the N-channel MOS transistor and the P-channel MOS transistor, respectively. As is understood from each of FIGS. 4 to 6, this source is common to each transistor.

As shown in FIGS. 4 to 6, the n+ diffusion layer 16 and the p+ diffusion layer 18 are connected to a corresponding bit line BL by a drain contact plug 26 embedded into the center of the ring and by a bit contact plug 29 provided in contact with an upper surface of the drain contact plug 26.

As shown in FIGS. 4 and 5, the n+ diffusion layer 17 is connected to a sense potential plane 33 functioning as the low-order driving wiring SAN, by a source contact plug 27 embedded between rings adjacent in X direction and by a sense-potential contact plug 32 provided in contact with an upper surface of the source contact plug 27. Similarly, the p+ diffusion layer 19 is connected to a sense potential plane 34 functioning as the high-order driving wiring SAP, by the source contact plug 27 and the sense-potential contact plug (a cross section of a connection portion is not shown).

Details of the configuration of the sense amplifier SA are as explained above.

Figure 7:
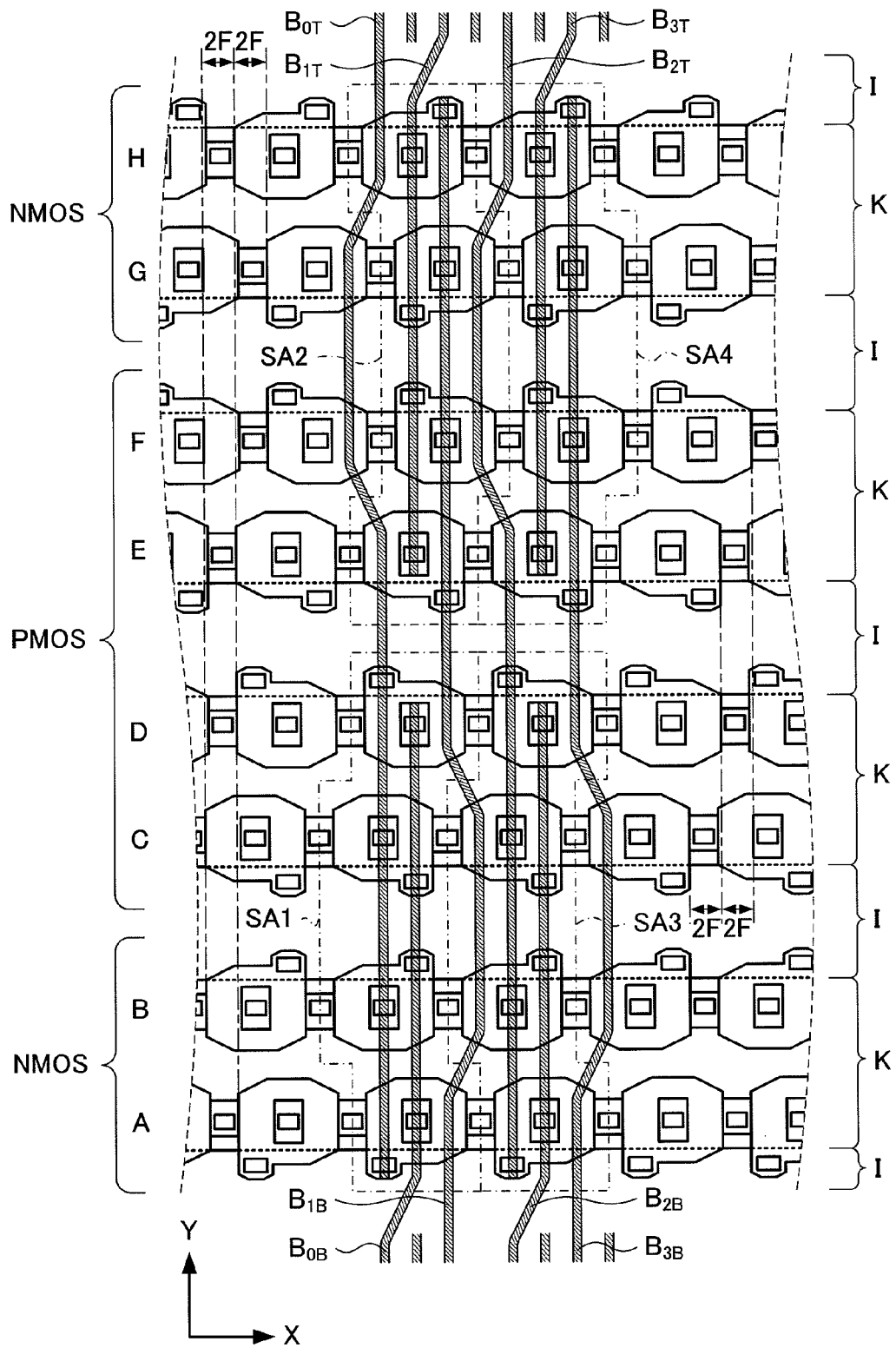
FIG. 7 shows a wiring layout of the bit lines connected to the sense amplifiers on the flat pattern layout of the sense amplifier area shown in FIG. 4.

FIG. 7 shows a wiring layout of the bit lines $B_{0T}$ to $B_{4T}$ and $B_{0B}$ to $B_{4B}$ connected to the sense amplifiers SA1 to SA4 on the flat pattern layout of the sense amplifier area SAA shown in FIG. 4. In FIG. 7, each bit line BL is electrically contacted to the bit contact plug 29 or the gate contact plug 30 where these are superimposed with each other.

As shown in FIG. 7, within each sense amplifier SA, two N-channel MOS transistors and two P-channel MOS transistors are in a line symmetrical shape by sandwiching the dielectric isolation region I between the transistors. N-channel MOS transistors in the A and B rows are arranged slightly deviated to the left direction in FIG. 7 as compared with N-channel MOS transistors in the G and H rows. A size of the deviation is the same as a size of a pitch of the bit lines BL (=2F; F is a minimum feature size). Similarly, P-channel MOS transistors in the C and D rows are arranged in deviation by 2F to the left direction in FIG. 7 as compared with N-channel MOS transistors in the E and F rows.

By arranging each of transistors as described above, each bit line BL is a straight line on individual corresponding sense amplifier SA as shown in FIG. 7. A length in the X direction of an area occupied by each sense amplifier SA is restricted to four bit lines (=8F). In other words, four sense amplifiers SA can be arranged in a size of eight bit lines in the X direction (=16F).

As explained above, according to the semiconductor memory device of the present embodiment, a length of each sense amplifier SA in the X direction can be shortened. Therefore, in the semiconductor memory device according to the present embodiment, while the entire DRAM is downscaled, that is, while a chip area is reduced, the above arrangement of sense amplifiers SA can be achieved by using a SAC line technique to form the contact plugs 26 and 27. Formation of the contact plugs 26 and 27 by the SAC line technique is explained in detail below while explaining a manufacturing process of the sense amplifiers SA.

Figure 10:
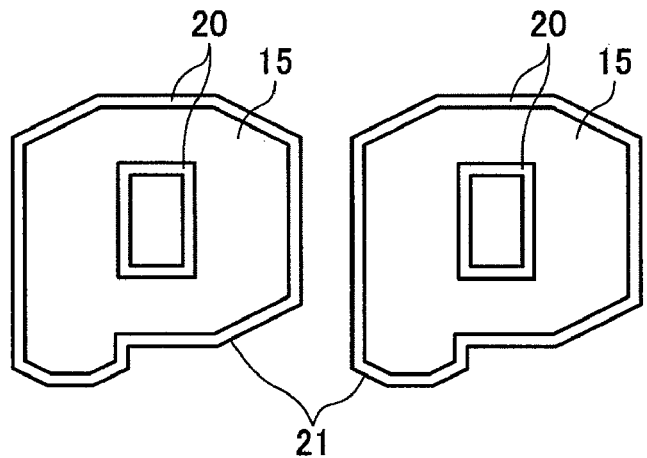
FIG. 10 shows a manufacturing process of the sense amplifiers and their peripheral wirings, and a plan view near the line B-B' in FIG. 4.
Figure 11:
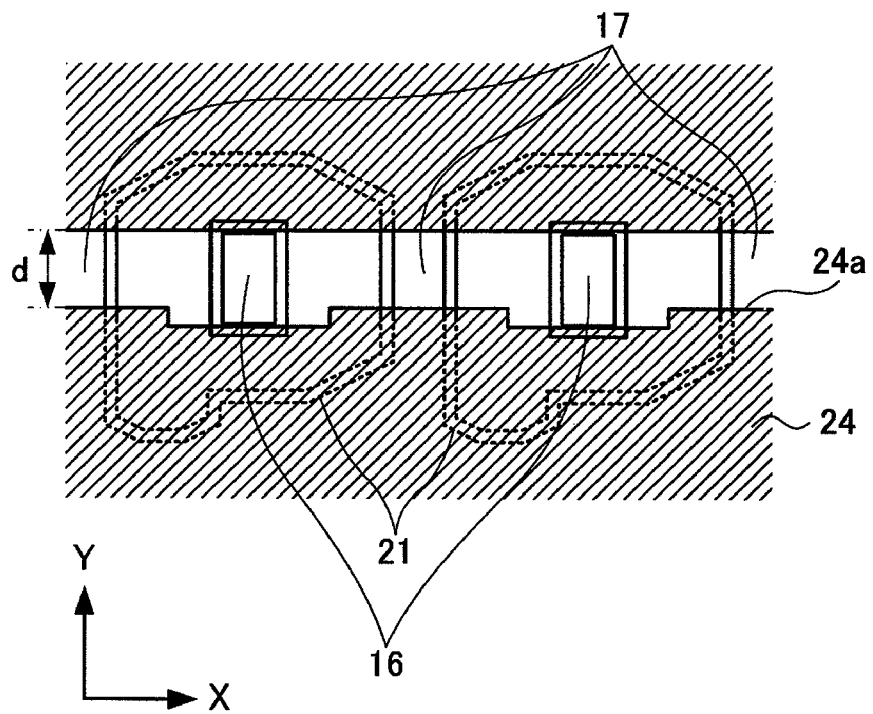
FIG. 11 shows a manufacturing process of the sense amplifiers and their peripheral wirings, and a plan view near the line B-B' in FIG. 4.
Figure 12:
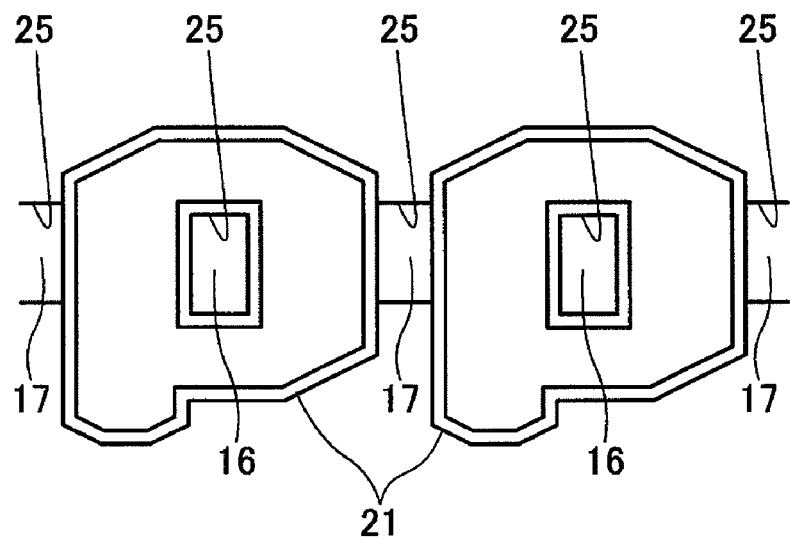
FIG. 12 shows a manufacturing process of the sense amplifiers and their peripheral wirings, and a plan view near the line B-B' in FIG. 4.

FIGS. 8, 9, 13, 14, and 15 are cross-sectional views along the line B-B' in FIG. 4. FIGS. 10 to 12 are plan views near the line B-B' in FIG. 4 (plan views near the transistor Tr4 of the sense amplifiers SA1 and SA3). These drawings show a manufacturing process of the sense amplifiers SA and their peripheral wirings. A manufacturing process of portions concerning the transistor Tr4 of the sense amplifiers SA1 and SA3 is explained below with reference to the above drawings as well as FIGS. 4 to 7.

First, a semiconductor substrate having the P-type semiconductor layer 10 is prepared. As shown in FIG. 6, impurity is implanted into a region to form a P-channel MOS transistor, thereby providing the N-type region 11. As shown in FIGS. 4 and 7, the dielectric isolation region I (the insulation layer 12) is provided to partition the active region K. In the following process, plural transistors are formed along the active region K.

Figure 8:
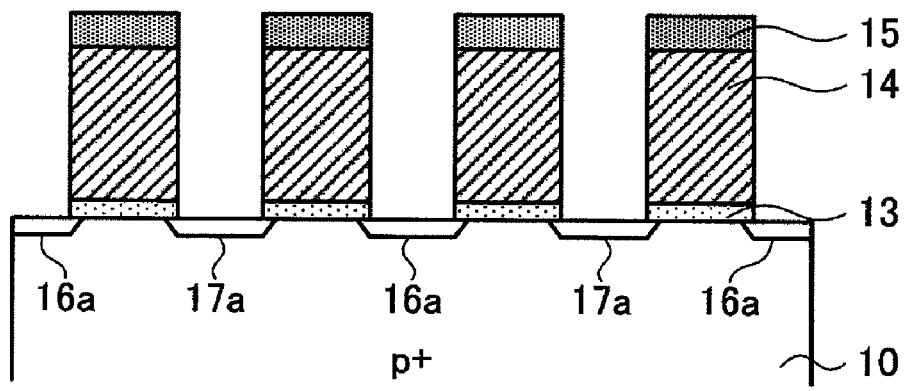
FIG. 8 shows a manufacturing process of the sense amplifiers and their peripheral wirings, and is cross-sectional views along the line B-B' in FIG. 4.

Next, as shown in FIG. 8, a silicon surface of the P-type semiconductor layer 10 is oxidized by using a thermal oxidation method, thereby forming an insulation film of silicon oxide having a film thickness of about 5 nm. A conductive material such as polycrystalline silicon is laminated by about 100 nm on the insulation film. A silicon nitride film having a film thickness of about 200 nm is formed on an upper surface of the laminated layer. A resultant layer is patterned in a ring shape shown in FIG. 4 by anisotropic etching using a mask pattern. By the above process, substantially cylindrical laminates are provided in plural, each having the gate dielectric film 13, the gate electrode 14, and the cap dielectric film 15 on the semiconductor layer 10, as shown in FIG. 8. The substantially cylindrical shape includes a shape having an open end on the dielectric isolation region I in addition to a complete cylindrical shape, in a similar manner to that of the substantially ring shape described above.

After the patterning is completed, n– diffusion layers 16a and 17a are formed on an exposed surface of the P-type semiconductor layer 10 by impurity ion implantation, as shown in FIG. 8. An internal region of the laminate is the re-diffusion layer 16a, and an external region is the n– diffusion layer 17a. While the n– diffusion layer 16a is formed in isolation for each laminate, the n– diffusion layer 17a is common within the active region K. Impurity concentration of the n– diffusion layers 16a and 17a formed at this stage is relatively low.

Figure 9:
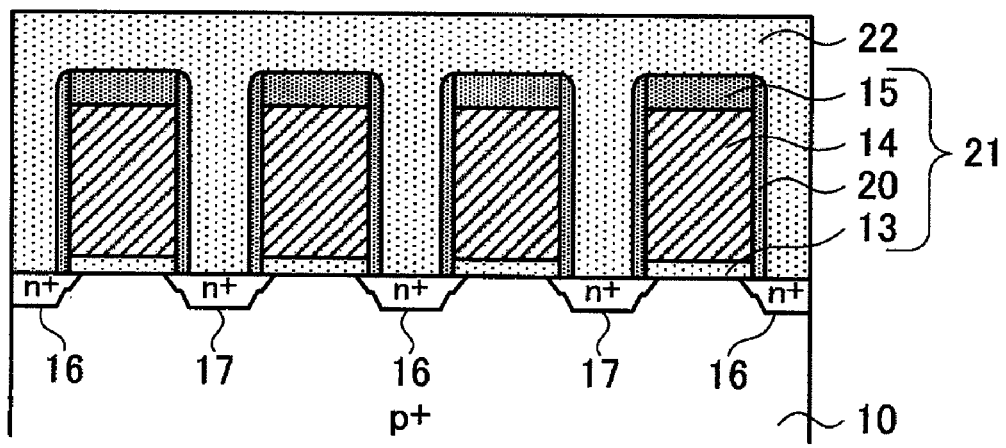
FIG. 9 shows a manufacturing process of the sense amplifiers and their peripheral wirings, and is cross-sectional views along the line B-B' in FIG. 4.

Next, the sidewall dielectric film 20 is formed to have a film thickness of about 20 nm on a side surface of the gate dielectric film 13, the gate electrode 14, and the cap dielectric film 15, respectively as shown in FIG. 9, by depositing a silicon nitride film on the entire surface by a CVD method and by etching back this film. By performing the above process, plural ring-gate structures 21 having a substantially cylindrical shape of which a surface and a side surface are covered by an insulation film are formed.

After the ring-gate structures 21 are formed, impurity ion implantation is performed again, thereby forming the n+ diffusion layers 16 and 17 on an exposed surface of the P-type semiconductor layer 10, as shown in FIG. 9. An internal region of the ring-gate structures 21 is the n+ diffusion layer 16, and an external region is the n+ diffusion layer 17. The n+ diffusion layer 16 is formed in isolation for each ring-gate structure 21, and functions as a drain region of each of transistors. Meanwhile, the n+ diffusion layer 17 is common within the active region K, and functions as a source region of each of transistors. Impurity concentration of the n+ diffusion layers 16 and 17 formed at this stage is relatively high. In this case, before performing the ion implantation to form the n+ diffusion layers 16 and 17, silicon can be selectively epitaxially grown on the n– diffusion layers 16a and 17a to form a selective epitaxial layer. Consequently, n+ diffusion layers 16 and 17 are formed by the diffusion of impurity via the selective epitaxial layer.

After the n+ diffusion layers 16 and 17 are formed, a silicon oxide film is deposited on the entire surface by about 500 nm, thereby forming the insulation layer 22 shown in FIG. 9. A surface of the insulation layer 22 is flattened beforehand by a CMP method or the like.

FIG. 10 is a plan view of a transistor in a state after the process shown in FIG. 9 is completed. However, FIG. 10 omits the insulation layer 22. As shown in FIG. 10, the ring-gate structure 21 having a ring shape is completed.

Next, as shown in FIG. 11, a mask layer 24 is formed on the insulation layer 22. A so-called hardmask is used for the mask layer 24. The mask layer 24 has a line-shaped opening 24a provided across plural contact plugs (transistors). That is, as shown in FIG. 5, the drain contact plug 26 is formed on the n+ diffusion layer 16, and the source contact plug 27 is formed at a position adjacent to the ring-gate structure 21 in the X direction on the n+ diffusion layer 17. The opening 24a is provided along the X direction across these contact plugs. In other words, the opening 24a is provided across an internal portion of plural ring-gate structures 21 (an area corresponding to the drain contact plug 26), across a part of each of the plural ring-gate structures 21, and across a portion sandwiched by adjacent ring-gate structures 21 (an area corresponding to the source contact plug 27).

A width d of the opening 24a in the Y direction is about a width exposing the entire surface of the n+ diffusion layer 17. Specifically, the width d is about 0.10 μm. As shown in FIG. 11, on the n+ diffusion layer 17, the width d can be a line width slightly smaller than this size, or can be the same size. That is, it is important to provide the opening 24a in a line shape, and it is not necessary to have the same width in the entire area of the line width, and the width can be slightly different.

The insulation layer 22 is selectively removed by selective etching using the mask layer 24 as a mask. That is, as described above, the cap dielectric film 15 and the sidewall dielectric film 20 are made of a silicon nitride film. On the other hand, the insulation layer 22 is made of a silicon oxide film. When a CF gas is used for etchant, an etching rate of a silicon oxide film becomes larger than that of a silicon nitride film. Therefore, only the insulation layer 22 can be selectively removed. Of course, a contact hole perpendicular to a direction of the sheet is partitioned by the insulation film 22.

The mask layer 24 has the opening 24a of a line shape provided across plural contact plugs as described above. A so-called the SAC line technique is used for this. As compared with provision of an opening for each contact plug (the SAC hole technique), etchant can efficiently move within the contact hole when the SAC line technique is used. Therefore, because etching can be efficiently performed, time required for the etching can be relatively short, and the cap dielectric film 15 and the sidewall dielectric film 20 can be formed relatively thin. The cap dielectric film 15 and the sidewall dielectric film 20 can have a thickness of about 20 nm as described above. On the other hand, when the SAC hole technique is used, a film thickness of about 30 nm is necessary.

Figure 13:
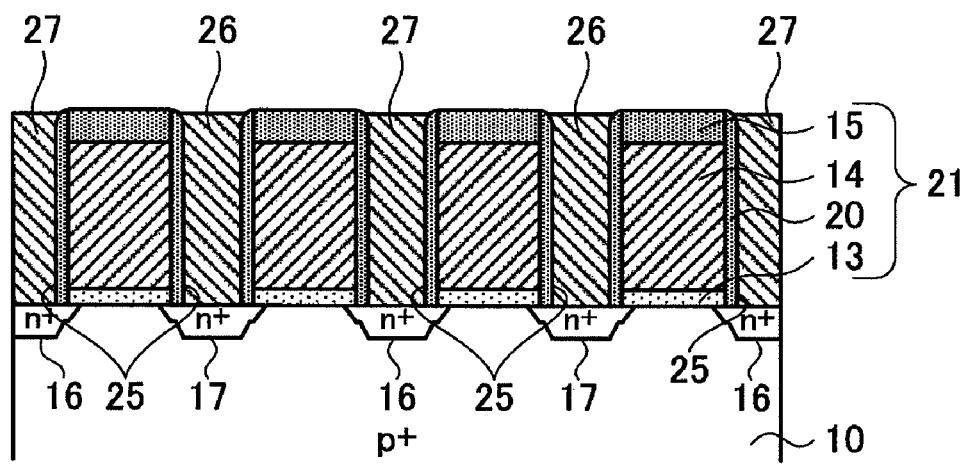
FIG. 13 shows a manufacturing process of the sense amplifiers and their peripheral wirings, and is cross-sectional views along the line B-B' in FIG. 4.

After the selective etching is finished, a contact hole 25 is formed on the n+ diffusion layers 16 and 17, thereby exposing the n+ diffusion layers 16 and 17. When a selective epitaxial layer is formed, this epitaxial layer is exposed. In this state, a conductive layer of polycrystalline silicon or a laminated film of TiN (titanium nitride) and W (tungsten) is deposited on the entire surface to have a thickness of about 100 nm. A deposited result is polished by CMP until when a surface of the ring-gate structure 21 is exposed. As a result, the contact plugs 26 and 27 are formed within each contact hole 25, as shown in FIG. 13.

Figure 14:
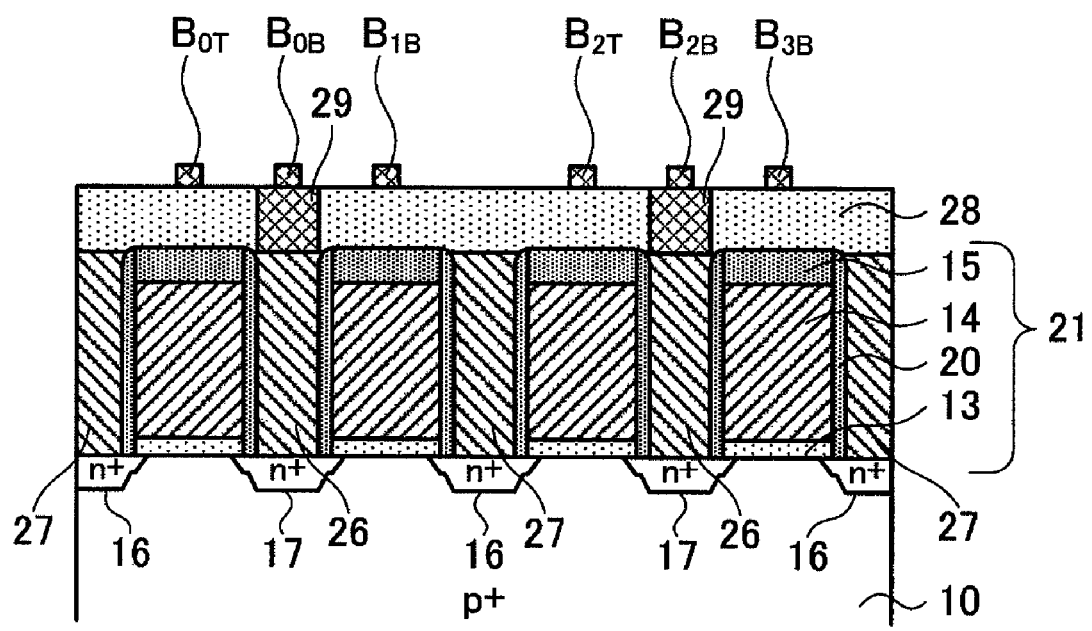
FIG. 14 shows a manufacturing process of the sense amplifiers and their peripheral wirings, and is cross-sectional views along the line B-B' in FIG. 4.

Next, an interlayer dielectric film 28 made of a silicon oxide film or the like is formed in a thickness of about 200 nm on the entire surface. A part of this film is etched to expose the contact plug 26, and the bit contact plug 29 in contact with the contact plug 26 is formed as shown in FIG. 14. Although not shown in FIG. 14, the gate contact plug 30 is also formed at this stage (see FIG. 6). A bit line BL is formed on the interlayer dielectric film 28.

Further, as shown in FIGS. 5 and 6, an interlayer dielectric film 31 that covers the interlayer dielectric film 28 and the bit line BL is formed, and a hole piercing through the interlayer dielectric films 28 and 31 is provided. The sense-potential contact plug 32 is formed in this hole. Finally, the sense potential planes 33 and 34 are formed on the interlayer dielectric film 31.

As explained above, in the manufacturing method of a semiconductor memory device according to the present embodiment, the opening 24a of the mask layer 24 has a line shape across the plural contact plugs 26 and 27. Therefore, as compared with a case of using the SAC hole technique, etchant can efficiently move within the contact hole. Consequently, time required for the etching can be relatively short, and the cap dielectric film 15 and the sidewall dielectric film 20 can be formed relatively thin. As a result, a distance between the contact plugs 26 and 27 and the gate electrode 14 can be reduced. With this arrangement, the semiconductor memory device according to the present embodiment is downscaled as the entire DRAM, that is, a chip area is reduced. Specifically, a length of the sense amplifier SA in the X direction can be reduced to a width of four bit lines.

It is apparent that the present invention is not limited to the above embodiments, but may be modified and changed without departing from the scope and spirit of the invention.

While the above embodiment has exemplified a case that a sense amplifier of a DRAM is applied to the present invention, the present invention can be widely applicable to other types of circuits that use a ring-gate transistor instead of a sense amplifier of a DRAM.

What is claimed is:

1. A manufacturing method of a semiconductor device including sense amplifiers that amplifies a potential difference between bit lines, the method comprising:
   forming a ring-shaped gate electrode and source and drain regions for transistors constituting the sense amplifiers;
   forming an insulating layer over the transistors;
   forming a mask layer on the insulating layer, the mask layer having a line-shaped opening that expose an area of the insulating layer covering respective portions of the source and drain regions of each of the transistors; and
   forming a plurality of contact plugs each electrically connected to an associated one of the source and drain regions by using a line SAC (Self-Align Contact) technique in which the area of the insulation layer is selectively removed by use of the mask layer.

2. The method as claimed in claim 1, wherein the opening is provided along a direction substantially orthogonal to the bit lines.

3. The method as claimed in claim 1, wherein the transistors constituting a same sense amplifier are arranged along the bit lines.

4. A manufacturing method of a semiconductor device, comprising:
   forming a plurality of substantially cylindrically-shaped gate electrodes covered with an insulation film;
   forming drain regions and source regions on the semiconductor substrate to form a plurality of transistors, each of the drain regions and each of the source regions correspond to an associated one of the gate electrodes;
   covering the transistors by an interlayer insulation layer;
   forming a plurality of contact holes partitioned by the insulation films and the interlayer insulation layer from one another by selectively removing the interlayer insulation layer by using a mask formed on the interlayer insulation layer, the mask having a line-shaped opening positioned over respective parts of the source and drain regions of the transistors with an intervention of the interlayer insulation layer; and
   forming a plurality of contact plugs that are embedded in the contact holes.

5. The method as claimed in claim 4, further comprising defining an active region by forming a dielectric isolation region in the semiconductor substrate,
   wherein the transistors are formed along the active region.

6. The method as claimed in claim 5, wherein the opening is provided along the active region.

7. The method as claimed in claim 5, wherein the transistors are formed so that a part of which is positioned on the dielectric isolation region.

8. The method as claimed in claim 5, wherein
a plurality of dielectric isolation regions are provided, thereby defining a plurality of active regions in parallel to each other, and
the transistors are formed along a respective one of the active regions.

9. The method as claimed in claim 4, wherein one of the drain region and the source region of each of the transistors is provided in an internal region surrounded by the cylindrically-shaped gate electrode, and the other one of the drain region and the source region of each of the transistors is provided in common to each of the transistors in an external region of the gate electrode.

10. The method as claimed in claim 9, wherein the drain region is provided for each of the transistors in the internal region, and the source region is provided in common to each of transistors in the external region.

11. A manufacturing method of a semiconductor device, comprising:
   defining an active region by a dielectric isolation region;
   forming a plurality of ring-gate structures for a plurality of transistors along the active region, each of the ring-gate structures having an upper surface and a side surface covered with an insulation film;
   forming a plurality of first regions each of which serves as one of a source region and a drain region of an associated one of the transistors, the first regions being portioned on the active region corresponding to an internal portion surrounded by an associated one of the ring-gate structures;
   forming a plurality of second regions each of which serves as other one of the source region and the drain region in common to each of the transistors, the second regions being portioned on the active region corresponding to an external portion of each of the ring-gate structures;
   covering the active region and the ring-gate structures by an interlayer insulation layer;
   forming a mask layer on the interlayer insulation layer having a line-shaped opening positioned over the internal portions of the ring-gate structures, a part of the ring-gate structures, and portions sandwiched by adjacent ring-gate structures with an intervention of the interlayer insulation layer;
   selectively removing the interlayer insulation layer by using the mask layer and the insulation film as a mask to form contact holes; and
   forming contact plugs within the contact holes, each of the contact plugs being connected to an associated one of the source and drain regions.

12. The method as claimed in claim 11, wherein the opening is provided in parallel to a row of the ring-gate structures.

13. The method as claimed in claim 11, wherein
the active region is included in a plurality of mutually parallel active regions, and
the row of the ring-gate structures is formed on an associated one of the active regions.

14. The method of as claimed in claim 11, wherein each of the first regions is the drain region of each of the transistors, and each of the second regions is the source region of each of the transistors.

* * * * *